US012696430B2

(12) United States Patent
Paul et al.

(10) Patent No.: US 12,696,430 B2
(45) Date of Patent: Jul. 28, 2026

(54) SEALING METHOD FOR DIRECT LIQUID COOLED POWER ELECTRONICS PACKAGE

(71) Applicant: SEMICONDUCTOR COMPONENTS INDUSTRIES, LLC, Scottsdale, AZ (US)

(72) Inventors: Roveendra Paul, Dublin, CA (US); Hyungsoo Kim, Yongin-si (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 218 days.

(21) Appl. No.: 18/364,330

(22) Filed: Aug. 2, 2023

(65) Prior Publication Data

US 2024/0064944 A1 Feb. 22, 2024

Related U.S. Application Data

(60) Provisional application No. 63/371,700, filed on Aug. 17, 2022.

(51) Int. Cl.
H05K 7/20 (2006.01)

(52) U.S. Cl.
CPC .............................. H05K 7/20927 (2013.01)

(58) Field of Classification Search
CPC ...... H05K 7/026; H05K 7/20; H05K 7/20254; H05K 7/20272; H05K 7/20409;
(Continued)

(56) References Cited

U.S. PATENT DOCUMENTS 9,003,649 B1 * 4/2015 Romero ............... B23K 20/127
                                                        29/830
9,204,579 B2 * 12/2015 Jaskari ............... H05K 7/20927
(Continued)

FOREIGN PATENT DOCUMENTS

CN        112530887 A        3/2021
JP        2000349211 A       12/2000
(Continued)

OTHER PUBLICATIONS

WO-2023224149-A1 English Translation (Year: 2023).*
JP-2006313054-A English Translation (Year: 2006).*

*Primary Examiner* — Amir A Jalali
(74) *Attorney, Agent, or Firm* — Brake Hughes Bellermann LLP

(57) ABSTRACT

A package includes a power electronics module disposed between a first bracket and a second bracket with the power electronics module covering openings in the first bracket and the second bracket. Leak-proof joints are formed between surfaces of the power electronics module and the first bracket and the second bracket. A first cover beam is disposed on, and joined to, the first bracket to enclose a first cooling fluid channel for cooling fluid flow over the power electronics module. A second cover beam is disposed on, and joined to, the second bracket to enclose a second cooling fluid channel for cooling fluid flow over the power electronics module. The package includes end connectors that have input and output ports for cooling fluid flow through the first cooling fluid channel and the second cooling fluid channel.

18 Claims, 11 Drawing Sheets

(58) Field of Classification Search
CPC ............... H05K 7/20418; H05K 7/205; H05K
7/20509; H05K 7/20772; H05K 7/20781;
H05K 7/20809; H05K 7/20845; H05K
7/2089; H05K 7/209; H05K 7/20927;
H05K 5/06; H05K 5/061; H01L 23/10;
H01L 23/3142; H01L 23/34; H01L
23/3672; H01L 23/3675; H01L 23/3677;
H01L 23/46; H01L 23/473; H01L
2023/405; H01L 2023/4056; H01L
21/4817; H01L 25/07; H01L 25/072
See application file for complete search history.

(56)                    References Cited

U.S. PATENT DOCUMENTS

| | | | | |
|---|---|---|---|---|
| 9,934,990 | B2 * | 4/2018 | Yoo | H01L 21/4882 |
| 10,665,525 | B2 | 5/2020 | Teysseyre et al. | |
| 10,798,854 | B2 * | 10/2020 | Lei | H05K 7/20872 |
| 11,610,832 | B2 | 3/2023 | Teysseyre et al. | |
| 2009/0057882 | A1 * | 3/2009 | Gerbsch | H01L 23/473 |
| | | | | 257/E23.098 |
| 2014/0168897 | A1 * | 6/2014 | Jaskari | H05K 7/20927 |
| | | | | 361/699 |
| 2014/0291832 | A1 | 10/2014 | Schwarz | |
| 2015/0041414 | A1 * | 2/2015 | Squillante | B01D 35/18 |
| | | | | 210/774 |
| 2015/0061112 | A1 * | 3/2015 | Bogen | H01L 23/3672 |
| | | | | 257/714 |
| 2016/0064303 | A1 * | 3/2016 | Ninomiya | H01L 23/3675 |
| | | | | 165/80.4 |
| 2016/0242312 | A1 * | 8/2016 | Singh | H01L 23/473 |
| 2016/0322279 | A1 * | 11/2016 | Schmit | H01L 23/4006 |
| 2018/0182643 | A1 | 6/2018 | Yoo et al. | |
| 2019/0157186 | A1 | 5/2019 | Campbell et al. | |
| 2019/0335608 | A1 | 10/2019 | Song et al. | |
| 2020/0388557 | A1 | 12/2020 | Yoo et al. | |
| 2021/0337703 | A1 * | 10/2021 | Lee | H01L 23/473 |
| 2021/0391236 | A1 * | 12/2021 | Tsuyuno | H01L 23/3677 |
| 2022/0130735 | A1 * | 4/2022 | Coppola | H01L 23/46 |
| 2022/0136775 | A1 * | 5/2022 | Wu | F28D 17/00 |
| | | | | 165/104.25 |
| 2022/0142016 | A1 * | 5/2022 | Gradinger | H05K 7/20927 |
| | | | | 361/699 |
| 2022/0254654 | A1 * | 8/2022 | Torresin | H01L 23/3677 |
| 2022/0328427 | A1 * | 10/2022 | Coppola | H01L 23/564 |
| 2023/0371200 | A1 * | 11/2023 | Lee | H05K 7/20272 |
| 2024/0030100 | A1 * | 1/2024 | Ruppert | H01L 21/4871 |
| 2024/0120255 | A1 * | 4/2024 | Truessel | H01L 23/544 |

FOREIGN PATENT DOCUMENTS

| | | | | | |
|---|---|---|---|---|---|
| JP | | 2006313054 | A | * | 11/2006 |
| WO | WO-2023224149 | A1 | * | 11/2023 | ........... H01L 25/072 |

* cited by examiner

100

200A

200A

200

300

300

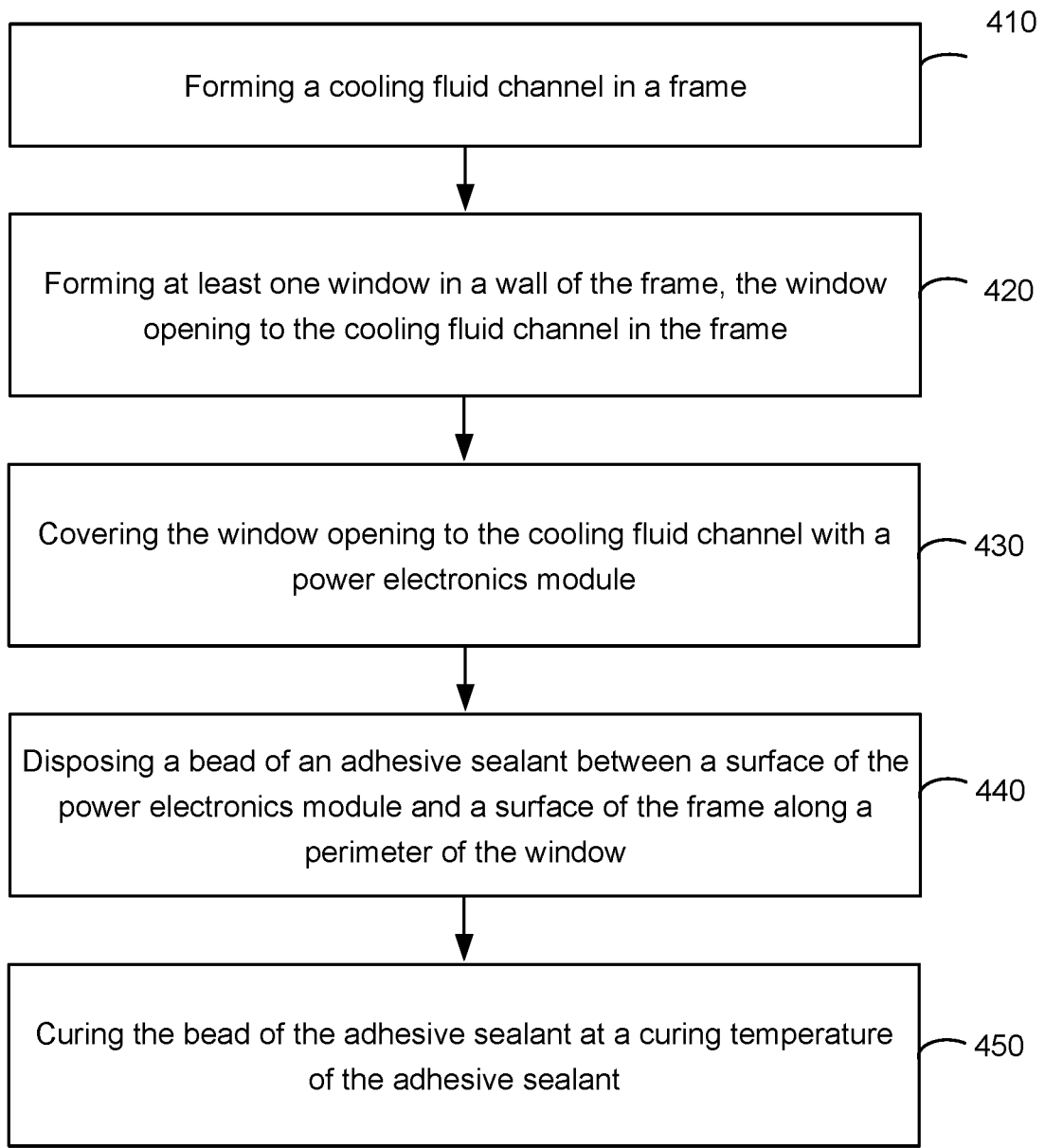

410 Forming a cooling fluid channel in a frame

420 Forming at least one window in a wall of the frame, the window opening to the cooling fluid channel in the frame 430 Covering the window opening to the cooling fluid channel with a power electronics module 440 Disposing a bead of an adhesive sealant between a surface of the power electronics module and a surface of the frame along a perimeter of the window 450 Curing the bead of the adhesive sealant at a curing temperature of the adhesive sealant

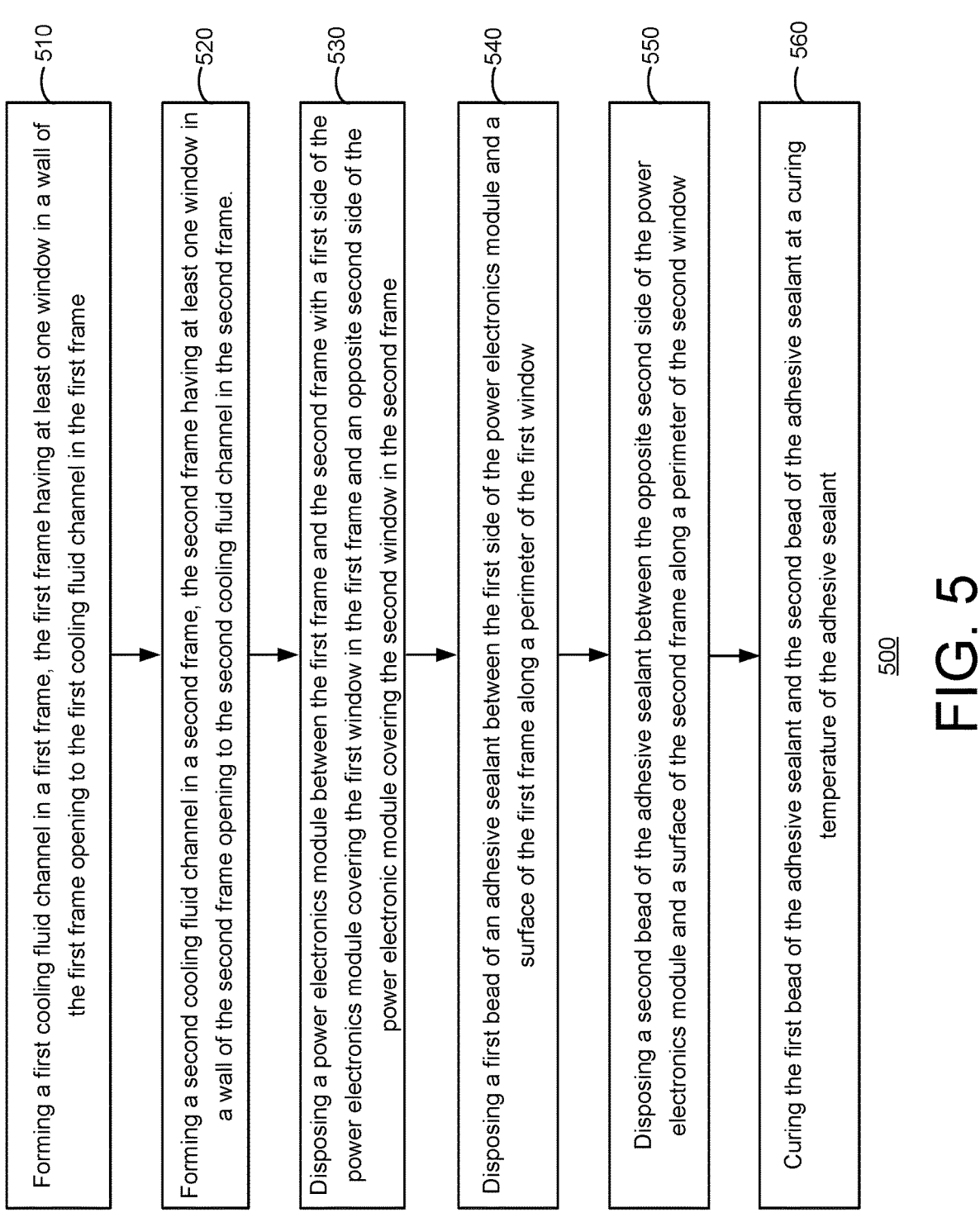

510 — Forming a first cooling fluid channel in a first frame, the first frame having at least one window in a wall of the first frame opening to the first cooling fluid channel in the first frame 520 — Forming a second cooling fluid channel in a second frame, the second frame having at least one window in a wall of the second frame opening to the second cooling fluid channel in the second frame.

530 — Disposing a power electronics module between the first frame and the second frame with a first side of the power electronics module covering the first window in the first frame and an opposite second side of the power electronic module covering the second window in the second frame 540 — Disposing a first bead of an adhesive sealant between the first side of the power electronics module and a surface of the first frame along a perimeter of the first window 550 — Disposing a second bead of the adhesive sealant between the opposite second side of the power electronics module and a surface of the second frame along a perimeter of the second window 560 — Curing the first bead of the adhesive sealant and the second bead of the adhesive sealant at a curing temperature of the adhesive sealant

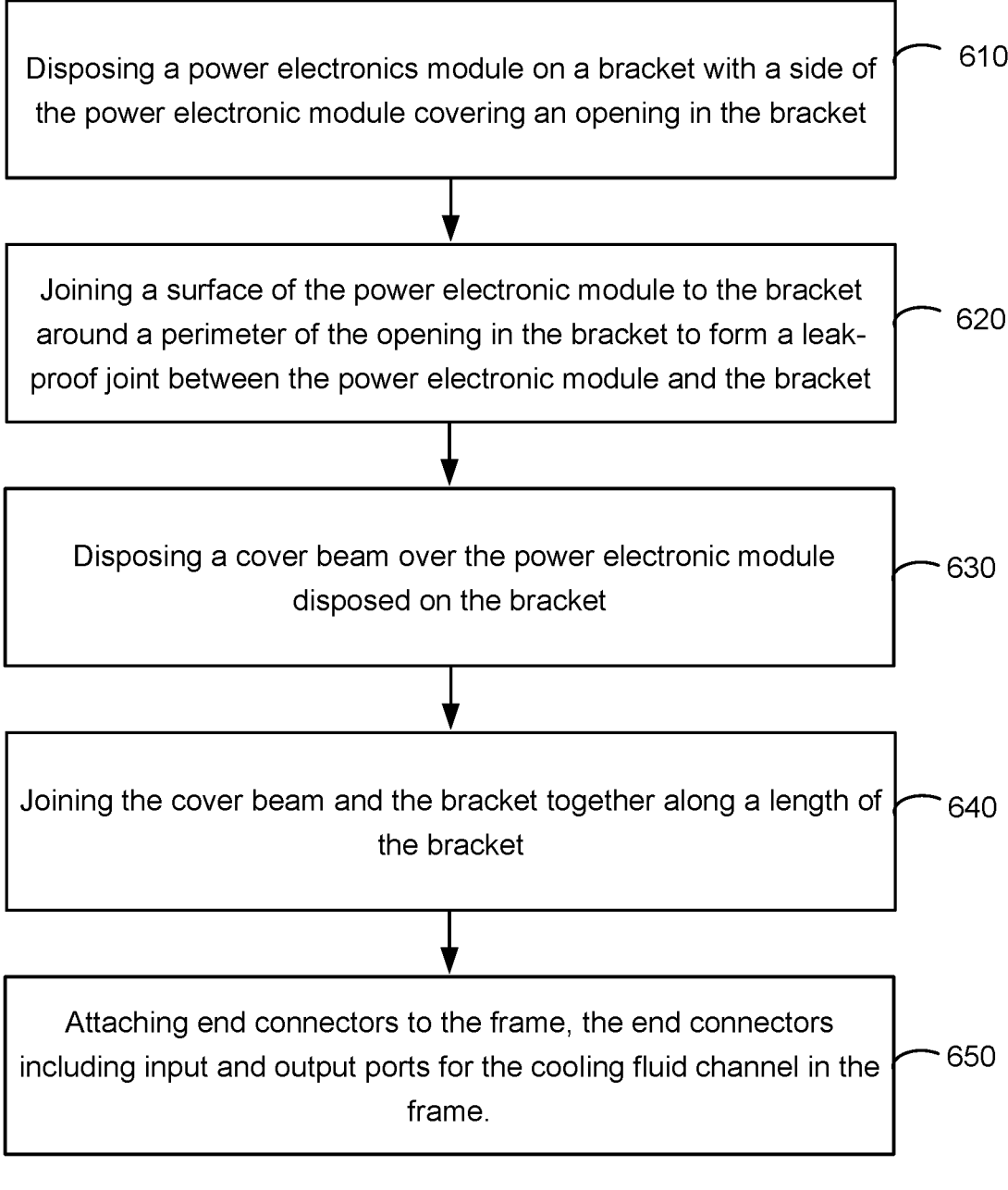

Disposing a power electronics module on a bracket with a side of the power electronic module covering an opening in the bracket — 610

Joining a surface of the power electronic module to the bracket around a perimeter of the opening in the bracket to form a leak-proof joint between the power electronic module and the bracket — 620

Disposing a cover beam over the power electronic module disposed on the bracket — 630

Joining the cover beam and the bracket together along a length of the bracket — 640

Attaching end connectors to the frame, the end connectors including input and output ports for the cooling fluid channel in the frame. — 650

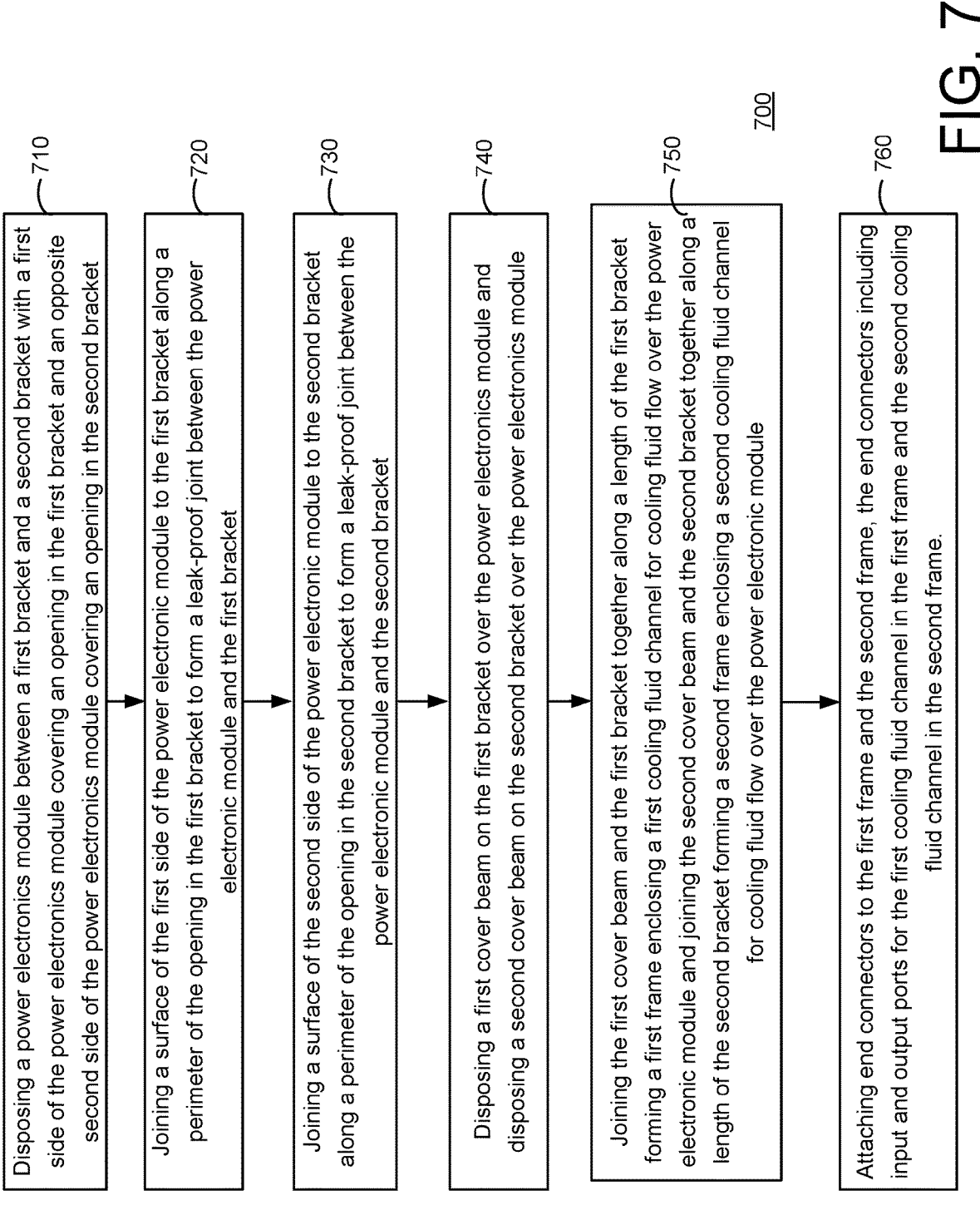

710 — Disposing a power electronics module between a first bracket and a second bracket with a first side of the power electronics module covering an opening in the first bracket and an opposite second side of the power electronics module covering an opening in the second bracket 720 — Joining a surface of the first side of the power electronic module to the first bracket along a perimeter of the opening in the first bracket to form a leak-proof joint between the power electronic module and the first bracket 730 — Joining a surface of the second side of the power electronic module to the second bracket along a perimeter of the opening in the second bracket to form a leak-proof joint between the power electronic module and the second bracket 740 — Disposing a first cover beam on the first bracket over the power electronics module and disposing a second cover beam on the second bracket over the power electronics module 750 — Joining the first cover beam and the first bracket together along a length of the first bracket forming a first frame enclosing a first cooling fluid channel for cooling fluid flow over the power electronic module and joining the second cover beam and the second bracket together along a length of the second bracket forming a second frame enclosing a second cooling fluid channel for cooling fluid flow over the power electronic module 760 — Attaching end connectors to the first frame and the second frame, the end connectors including input and output ports for the first cooling fluid channel in the first frame and the second cooling fluid channel in the second frame.

SEALING METHOD FOR DIRECT LIQUID COOLED POWER ELECTRONICS PACKAGE

RELATED APPLICATIONS

This claims the benefit of and priority to U.S. Provisional Application No. 63/371,700, filed Aug. 17, 2022, which is incorporated by reference herein in its entirety.

TECHNICAL FIELD

This disclosure relates to cooling systems for power electronics assemblies.

BACKGROUND

Effective thermal management of power electronics assemblies or packages is needed for increasing power density and improving reliability in many applications (e.g., in electric drive vehicles). A power electronics assembly can include heat-generating semiconductor devices (e.g., an insulated-gate bipolar transistor (IGBT) and a fast recovery diode (FRD)) assembled in a power electronics module. The power electronics module is housed in a sealed container (e.g., a cooling fluid jacket). A cooling fluid flow through the sealed container can be used to draw heat generated by the semiconductor devices out of the sealed container. Compact packaging of power electronics assemblies creates thermal management challenges that need to be addressed for power-dense systems.

SUMMARY

In a general aspect, a method includes disposing a power electronic module on a bracket with a side of the power electronic module covering an opening in the bracket, and joining a surface of the power electronic module to the bracket around a perimeter of the opening in the bracket to form a leak-proof joint between the power electronic module and the bracket. The method further includes disposing a cover beam over the power electronic module disposed on the bracket, and joining the cover beam and the bracket together along a length of the bracket. The cover beam and the bracket form a frame enclosing a cooling fluid channel for cooling fluid flow over the power electronic module. The method further includes attaching end connectors to the frame. The end connectors include input and output ports for the cooling fluid channel in the frame.

In a general aspect, a method includes disposing a power electronics module between a first bracket and a second bracket with a first side of the power electronics module covering an opening in the first bracket and an opposite second side of the power electronics module covering an opening in the second bracket, joining a surface of the first side of the power electronics module to the first bracket along a perimeter of the opening in the first bracket to form a leak-proof joint between the power electronics module and the first bracket, and joining a surface of the opposite second side of the power electronics module to the second bracket along a perimeter of the opening in the second bracket to form a leak-proof joint between the power electronics module and the second bracket. The method further includes disposing a first cover beam on the first bracket over the power electronics module and disposing a second cover beam on the second bracket over the power electronics module. The method further includes joining the first cover beam and the first bracket together along a length of the first bracket forming a first frame enclosing a first cooling fluid channel for cooling fluid flow over the power electronics module and joining the second cover beam and the second bracket together along a length of the second bracket forming a second frame enclosing a second cooling fluid channel for cooling fluid flow over the power electronics module. The method further includes attaching end connectors to the first frame and the second frame. The end connectors include input and output ports for the first cooling fluid channel in the first frame and the second cooling fluid channel in the second frame.

In a general aspect, a method includes forming a cooling fluid channel in a frame, forming an opening to the cooling fluid channel in a wall of the frame, and covering the opening in the wall of the frame with a power electronics module. The method further includes disposing a bead of an adhesive sealant between a surface of the power electronics module and a surface of the frame along a perimeter of the opening, and curing the bead of the adhesive sealant at a curing temperature of the adhesive sealant.

In a general aspect, a package includes a power electronics module disposed between a first bracket and a second bracket with a first side of the power electronics module covering an opening in the first bracket and an opposite second side of the power electronics module covering an opening in the second bracket, a joint between a surface of the first side of the power electronics module and the first bracket along a perimeter of the opening in the first bracket, and a joint between a surface of the opposite second side of the power electronics module and the second bracket along a perimeter of the opening in the second bracket. A first cover beam is disposed on the first bracket over the power electronics module and a second cover beam is disposed on the second bracket over the power electronics module. The package further includes a first joint between the first cover beam and the first bracket along a length of the first bracket and a second joint between the second cover beam and the second bracket together along a length of the second bracket. The first cover beam and the first bracket form a first frame enclosing a first cooling fluid channel for cooling fluid flow over the power electronics module. The second cover beam and the second bracket form a second frame enclosing a second cooling fluid channel for cooling fluid flow over the power electronics module. End connectors attached to the first frame and the second frame include input and output ports for the first cooling fluid channel in the first frame and the second cooling fluid channel in the second frame.

BRIEF DESCRIPTION OF THE DRAWINGS

FIG. 4 illustrates an example method for making a leak-proof joint in an integrated power electronics package.

FIG. 5 shows an example method for making leak-proof joints in an integrated power electronics package.

FIG. 6 illustrates another example method for making a leak-proof joint in an integrated power electronics package.

FIG. 7 shows another example method for making leak-proof joints in an integrated power electronics package.

Figure 1A:
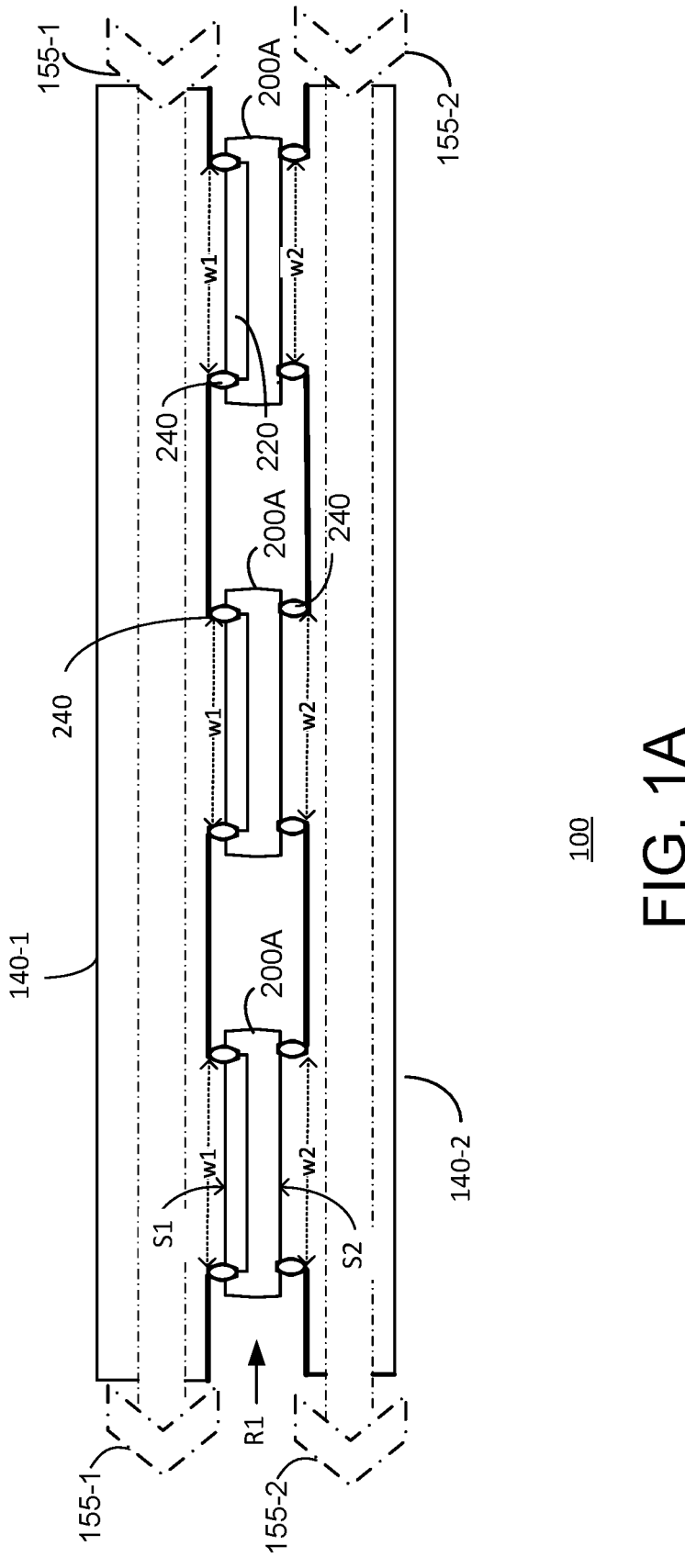
FIG. 1A schematically illustrates removal of heat from a multiplicity of power electronics modules in an integrated power electronics package by streams of cooling fluid flowing across surfaces of power electronics modules, in accordance with the principles of the present disclosure.

In the drawings, which are not necessarily drawn to scale, like reference symbols and or alphanumeric identifiers may indicate like and/or similar components (elements, structures, etc.) in different views. The drawings illustrate, by way of example, but not by way of limitation, various implementations discussed in the present disclosure. Reference symbols and or alphanumeric identifiers shown in one drawing may not be repeated for the same, and/or similar elements in related views in other drawings. Reference symbols and or alphanumeric identifiers that are repeated in multiple drawings may not be specifically discussed with respect to each of those drawings but are provided for convenience in cross reference between related views. Also, not all like elements in the drawings are specifically referenced with a reference symbol and or an alphanumeric identifier when multiple instances of an element are illustrated.

DETAILED DESCRIPTION

The present disclosure is directed to a heat management system for a power electronics package. The power electronics package (e.g., an integrated power electronics package) may be modular and may include multiple power electronics modules (or sub-packages).

A power electronics module (or sub-package) may, for example, include power electronic devices (e.g., silicon-controlled rectifiers (SCRs), insulated-gate bipolar transistors (IGBTs), field effect transistors (FETs), silicon carbide (SiC) power transistors, etc.) to provide AC power to loads. The power electronic devices can be silicon based, silicon carbide based, or based on other wide band gap (WBG) semiconductors. The power electronic devices can generate heat which has to be removed to keep the devices at acceptable operating temperatures. For high power density applications (e.g., power density at or greater than 240 kW) the demands for efficient heat removal can be severe.

In example implementations, the power electronics module may include at least a semiconductor die (e.g., an IGBT and/or an FRD). The semiconductor die may be mounted on a top surface of substrate (e.g., a printed circuit board, a direct bonded metal (DBM) substrate, a direct bonded copper (DBC) substrate, etc.). The semiconductor die or dies may be packaged (e.g., encapsulated in a molding compound), for example, as a single side direct cooled (SSDC) power electronics module or a dual side directly or indirectly cooled (DSC) power electronics module with signal pins and power terminals extending from the module. The power electronics module may have a width (WM) and a height (HM) along a surface of the substrate, and a thickness (TM) perpendicular (generally perpendicular) to the substrate (in the direction of the semiconductor die mounted on the top surface of substrate). In example implementations, for an example IGBT power electronics module, height HM and width WM may be measured in centimeters, while thickness TM may be in the range of a few millimeters or less.

Heat generated by the semiconductor die or dies flows perpendicularly through the substrate for dissipation from a bottom surface of the substrate. In some instances, a heat sink (e.g., a baseplate, or a baseplate with fins) may be attached to the bottom surface of the substrate to aid in dispersal of the heat generated in the power electronics module. The baseplate with fins may include pin fins (i.e., fins shaped like pins). The power electronics module may be further configured with either forced air and liquid cooled options to remove the heat generated in the power electronics module.

In example implementations, an integrated power electronics package may be modular and may include multiple power electronics modules (or sub-packages) in a single integrated power electronics package for use in various applications (e.g., three-phase inverters; DC/DC convertors; choppers; half or full bridge; and power supply applications, etc.). For example, an integrated power electronics package for many automotive applications may integrate up to six IGBT modules in a 6-pack configuration or a 3-pack configuration. The multiple power electronics modules (or sub-packages) (e.g., the six or three IGBT modules) may be placed electrically in parallel.

In example implementations, the integrated power electronics package may include (or be integrated with) a heat management system. The heat management system may utilize a cooling fluid (e.g., water, or a water-glycol mixture) to remove heat generated in the integrated power electronics package. The heat management system may include at least a manifold or jacket (e.g., a tube or container) including a cooling fluid passageway or channel. The multiple power electronics modules of the integrated power electronics package can be disposed on a side of the cooling fluid channel in contact with the cooling fluid. In example implementations, the manifold or jacket may have a rectangular cylinder shape with a length L between an input end and an output end, and a width W and a height H in a cross-section (e.g., a rectangular cross-section) perpendicular to the length. The manifold or jacket including the cooling fluid channel may be formed in a three-dimensional rectangular frame (a hollow rectangular frame) with an input port and an output port disposed in opposing end connectors of the frame. The frame may include openings (e.g., also can be referred to as windows (e.g., rectangular openings)) in a sidewall of the frame. The power electronics modules may be placed over the openings so that a side of the power electronics modules is exposed to cooling fluid in the cooling fluid channel.

A stream of the cooling fluid can enter the manifold through the input port, pass over a side (e.g., a top side) the multiple power electronics modules placed over the opening or windows in the sidewall of the frame along the cooling fluid channel in the manifold to remove heat generated by the power electronics modules, and exit the manifold through the output port. Opposing end connectors including the input and output ports of the frame may be attached to the frame using an adhesive sealant. The stream of the cooling fluid may be driven by a recirculating pump (not shown).

The multiplicity of power electronics modules placed in sequence in the row may be supported on the frame. The frame may extend in the direction of the row and have windows (openings) exposing the bottom surfaces of the substrates (on the front surfaces of which semiconductor dies are mounted in the power electronics modules) to the interior of the frame (i.e., the cooling fluid channel). The power electronics modules may be placed on the openings to cover, close, or seal the openings (windows) in the sidewall of the frame, and to thereby confine the cooling fluids to the cooling fluid channel within the three-dimensional rectangular frame.

Baseplates (e.g., baseplates with pin-fins) if attached to the bottom surfaces of the substrates may protrude (at least the pin fins) on an outside of the frame through the openings (windows).

Power terminals and signal pins of each of the multiplicity of power electronics modules placed in the manifold may extend to an outside of the manifold/integrated power electronics package.

In example implementations (e.g., in a dual side cooled integrated power electronics package), the cooling fluid channel may be a first cooling fluid channel (e.g., a top cooling fluid channel) and the jacket enclosing the first cooling fluid channel may be a first jacket (e.g., a top jacket).

In the dual side cooled integrated power electronics package, the baseplate pin fins of the power electronics modules placed in the row may also be exposed to a stream of cooling fluid flowing through another cooling fluid channel (e.g., a bottom cooling fluid channel). This bottom cooling fluid channel may be included in a second manifold or jacket (e.g., a bottom jacket) in the power electronics modules. The second jacket, like the first jacket, may be formed in a three-dimensional rectangular frame (a second frame) with an input port and an output port disposed in opposing end connectors of the frame. The opposing end connectors including the input and output ports of the second frame may be attached to the frame using an adhesive sealant. The second frame may include openings or windows (e.g., rectangular openings) in a sidewall of the second frame. The power electronics modules may be placed over the openings (windows) to close or seal the openings (windows) in the sidewall of the second frame, and to thereby confine the cooling fluids to the bottom cooling fluid channel within the second frame.

A stream of the cooling fluid can enter the second jacket through the input port, pass over a side (e.g., a bottom side) the multiple power electronics modules placed over the openings (windows) in the sidewall of the second frame along the cooling fluid channel in the second jacket to remove heat generated by the power electronics modules, and exit the second jacket through the output port. In example implementations the first jacket and the second jacket may have a common input port and a common output port.

In accordance with the principles of the present disclosure, a leak-proof joint is made between surfaces of a power electronics module and surfaces of a frame enclosing a cooling fluid channel in an integrated power electronics package.

The power electronics module is placed over an opening (window) in the frame (e.g., a three-dimensional rectangular frame) alongside the cooling fluid channel and attached (sealed) to the frame to confine the cooling fluids flowing in the cooling fluid channel to within the frame.

In some example implementations, the leak-proof joint between the power electronics module and the frame is made by an adhesive sealant disposed along a periphery or perimeter of the opening (window). The adhesive sealant may be disposed as bead of sealant material along a periphery of the opening (window) in the frame (e.g., in groove along a perimeter of the opening in the frame, or on a perimeter of a surface, a heat sink or baseplate attached to a substrate of the power electronics module).

In some example implementations, the leak-proof joint between the power electronics module and the frame may, for example, be a fused joint (e.g., a welded joint). The leak-proof joint may be formed along the periphery or perimeter of the opening (window), for example, by fusing or welding metal surfaces of the frame at periphery or perimeter of the opening (window) to, for example, a metal surface of a substrate of the power electronics module, or a surface of a heat sink or baseplate attached to a substrate of the power electronics module. In example implementations, the joint may be a fused joint, a laser-welded joint, or a friction stir welded joint joint.

FIG. 1A is a schematic diagram illustrating removal of heat from a multiplicity of power electronics modules by streams of cooling fluid flowing across surfaces of the power electronics modules. In some implementations, a power electronics module may, for example, be single side direct cooled (SSDC) power electronics module that has surfaces (e.g., substrate surfaces) for dissipating heat generated by devices in the power electronics modules to an outside of the module. With direct cooling, the cooling medium (e.g., a 50/50 water/glycol mix) is in direct contact with the power module. In some implementations, a power electronics module may, for example, be a dual side indirectly cooled power electronics module that offers indirect or direct cooling on both sides of the module. With indirect cooling, the module is attached to a sealed heatsink that is actively cooled with a cooling liquid.

As shown in FIG. 1A, the multiple power electronics modules (e.g., power electronics module 200A, FIG. 1B and FIG. 1C) may be disposed in sequence in a row (e.g., row R1) between a first cooling fluid channel 155-1 enclosed in a first rectangular frame 140-1, and a second cooling fluid channel 155-2 enclosed in a second rectangular frame 140-2. A power electronics module (e.g., power electronics module 200A, FIG. 2) disposed in row R1 may have a metallized front surface S1 (e.g., a substrate surface) and a metallized back surface S2 (e.g., a heatsink surface or a baseplate surface). The front surfaces (e.g., front surface S1) of the multiple power electronics modules may be exposed through windows w1 in the first rectangular frame 140-1 to cooling fluids in cooling fluid channel 155-1 for heat removal. The back surfaces (e.g., back surface S2) of the multiple power electronics modules may be exposed through windows w2 in the second rectangular frame 140-2 to cooling fluids in cooling fluid channel 155-2 for heat removal.

A first stream of cooling fluid may flow across the heat generating (dissipating) front surfaces (e.g., front surface S1)) of the multiplicity of power electronics modules in sequence in a straight flow path through cooling fluid channel 155-1, and a second stream of cooling fluid may flow across the heat generating (dissipating) back surfaces ((e.g., back surface S2)) of the multiplicity of power electronics modules in sequence in a straight flow path through cooling fluid channel 155-2.

In accordance with the principles of the present disclosure, leak-proof joints may be used to join or attach the surfaces (e.g., front surface S1, back surface S2) of the multiple power electronics modules to surfaces of frame 140-1 and 140-2 to seal windows w1 and w2, respectively. The leak-proof joints (e.g., adhesive sealant joint 240) may extend around the perimeters of the windows (e.g., windows w1 and w2) and may hermetically seal the windows to prevent leakage of cooling fluid from cooling fluid channel 155-1 and cooling fluid channel 155-2, respectively, around the edges of the windows.

In some example implementations, the leak-proof joints can be adhesive sealant joints (e.g., an adhesive sealant joint 240) made of, for example, high temperature adhesive sealants (e.g., polymer, epoxy, or silicone materials) (e.g., ELASTOSIL RT 723 AB sold by Wacker Chemie AG). In some example implementations, the leak-proof joints can be welded joints (e.g., laser-welded joints).

Figure 1B:
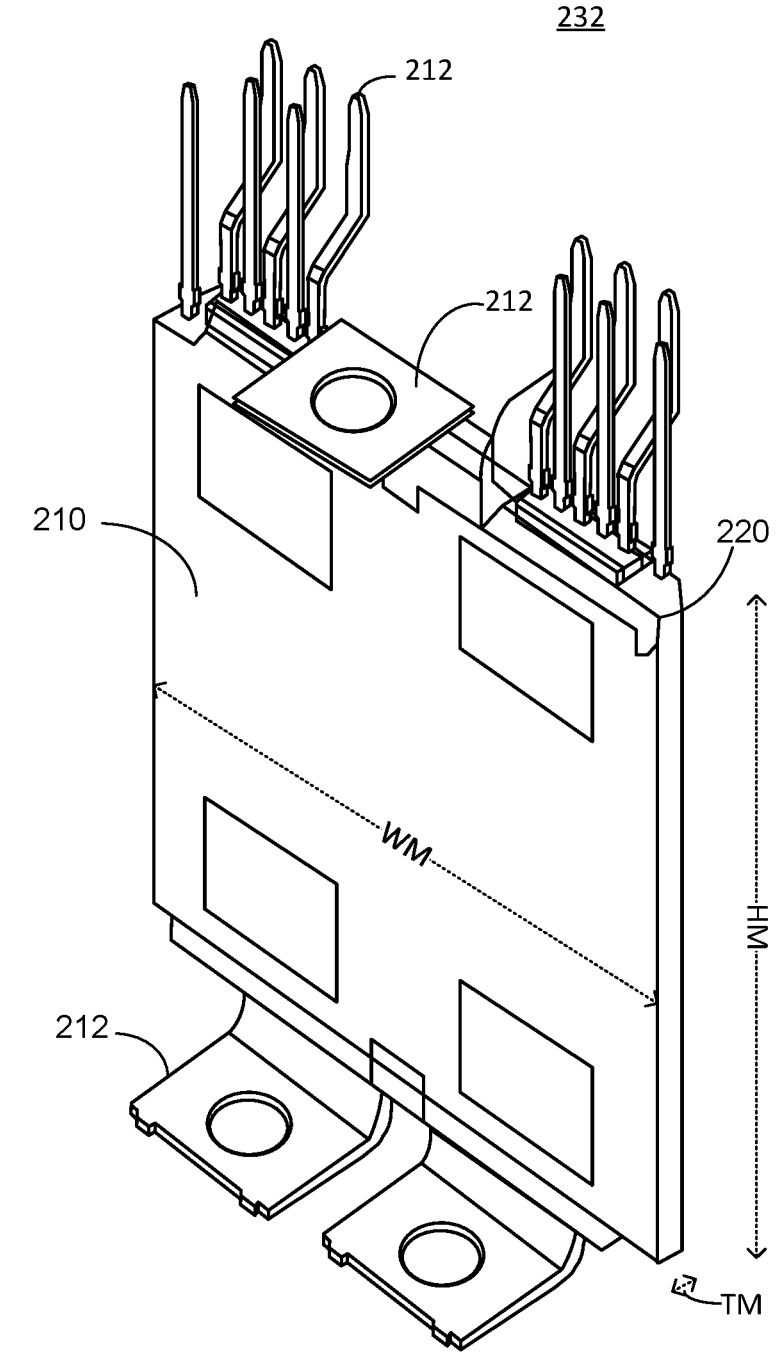
FIG. 1B illustrates, in a perspective view, a front side of an example power electronics module.
Figure 1B:
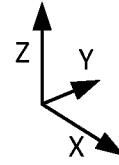
Figure 1C:
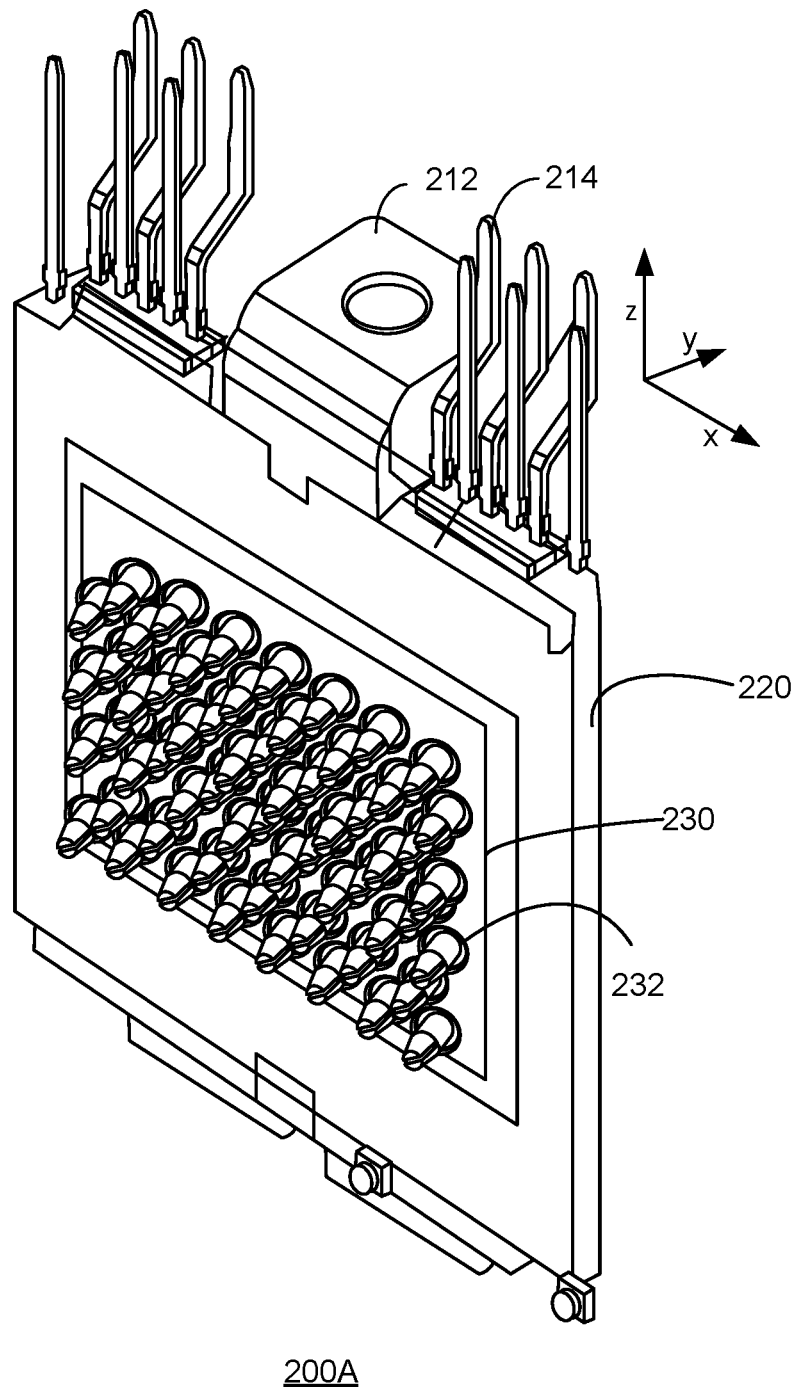
FIG. 1C illustrates, in a perspective view, a back side of the example power electronics module of FIG. 1B.

FIG. 1B and FIG. 1C shows an example power electronics module 200A that can be used in the integrated power electronics package 100 of FIG. 1A. FIG. 1B shows a front side view of power electronics module 200A, and FIG. 1C shows a backside side view of power electronics module 200A.

Power electronics module 200A may for example, include a power semiconductor die (e.g., an IGBT) (not shown) mounted on a top surface of a substrate (e.g., a direct bonded copper (DBC) substrate) (e.g., substrate 220) and packaged (encapsulated) in an encapsulant 210 (e.g., as an SSDC package). Power electronics module 200A may have the encapsulated portion (encapsulant 210) having a width WM a height HM, and a thickness TM. Power terminals 212 and signal terminals 214 of the power electronics module 200A may extend from the encapsulated portion (encapsulant 210). As shown in FIG. 1C, a heat sink (e.g., baseplate 230) may be attached to a back surface (e.g., surface S) of substrate 220 (e.g., a thermally conductive substrate) to aid in the dispersal of heat generated by the power semiconductor device mounted on the top surface (not shown) of substrate 220. In example implementations, an array of fins (e.g., pin fin 232) may extend outwardly (e.g., perpendicularly) from baseplate 230.

Figure 2:
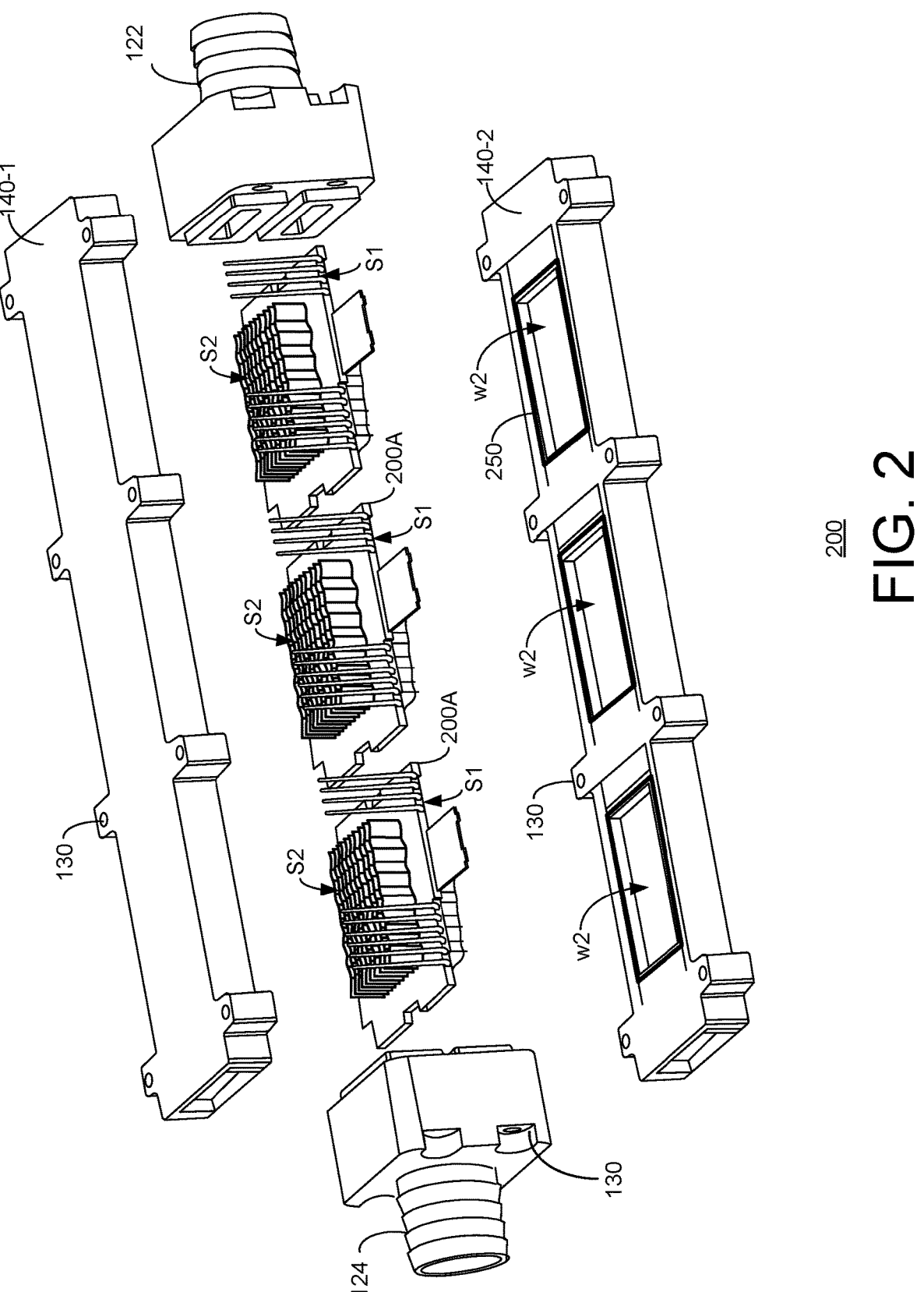
FIG. 2 illustrates an exploded view of an example integrated power electronics package.

FIG. 2 shows, for example, an exploded view of the various structural components of an integrated power electronics package 200 with dual side cooling of a row of power electronics modules (e.g., power electronics module 200A), in accordance with the principles of the present disclosure.

In package 200, a row of power electronics modules (e.g., three power electronics module 200A) may be cooled by a first stream of cooling fluid flowing across a top side of the power electronics modules, and a second stream of cooling fluid flowing across a bottom side of the power electronics modules. FIG. 2 shows integrated power electronics package 200 in a disassembled condition before leak-proof joints between the power electronic modules and the frames enclosing cooling fluid channels are made.

As shown in FIG. 2, integrated power electronics package 200 includes two rectangular frames (e.g., frame 140-1, frame 140-2) that respectively include cooling fluid channels (e.g., cooling fluid channel 155-1 and cooling fluid channel 155-2, FIG. 1) for flowing cooling fluids over a top side (e.g., front surface S1) and a bottom side (e.g., back surface S2) of the row of power electronics modules (e.g., power electronics module 200A). Integrated power electronics package 200 also includes end connectors (e.g., input port 122, and output port 124) that can receive and output cooling fluids through the cooling fluid channels (e.g., cooling fluid channel 155-1 and cooling fluid channel 155-2, FIG. 1) in frame 140-1 and frame 140-2.

Frame 140-1 may include windows w1 (not visible in FIG. 2) and frame 40-2 may include windows (e.g., window w2) through which power electronics modules (e.g., power electronics module 200A) placed over the windows can be exposed to the cooling fluids flowing through the cooling fluid channels (e.g., cooling fluid channel 155-1 and cooling fluid channel 155-2, FIG. 1) in frame 140-1 and frame 140-2.

As shown in FIG. 2, a bead of adhesive sealant 250 (e.g., a temperature curable epoxy or polymer) may be deposited on the frame (e.g., frame 140-2) along the perimeters of the windows (e.g., window w2). Adhesive sealant 250 may have a melting temperature that is substantially higher (e.g., at least 10% higher) than a maximum operating temperature of an integrated power electronics package 200.

When an integrated power electronics package 200 is assembled, the power modules (e.g., power electronics module 200A) may be sandwiched with compressive force between frame 140-1 and frame 140-2 having the beads of adhesive sealant (adhesive sealant 250) disposed along the perimeters of the windows (e.g., window w1 and window w2). The beads of adhesive sealant (adhesive sealant 250) may, for example, be disposed in grooves along the perimeters of the windows.

The assembly may be placed in a curing oven and heated to a curing temperature. The curing temperature may be below the maximum operating temperature of integrated power electronics package 200. After curing, the adhesive sealant 250 may form leak-proof joints (e.g., adhesive sealant joint 240, FIG. 1A) between the perimeters of the windows (e.g., windows w1 and window w2) and the top and bottom surfaces of the power modules (e.g., power electronics module 200A).

In some example implementations, the various structural components of integrated power electronics package 100 (e.g., cover beams, end connectors, fluid input and output ports, etc.) may be assembled using, for example, nut-and-bolt assemblies (e.g., nut-and-bolt assembly 130). In some example implementations, the various structural components of integrated power electronics package 100 may also be assembled using adhesives, O-ring and groove arrangements, or other coupling members (not shown in FIG. 1A).

In the example integrated power electronics package 100 described above (e.g., with reference to FIGS. 1A-2), the leak-proof joints (adhesive sealant joint 240, FIG. 1A) in integrated power electronics package are made of adhesive sealants. As mentioned previously in some example implementations, the leak-proof joints may be joints that are formed, for example, by welding or fusing metallized surfaces of the power modules (e.g., power electronics module 200A) to the surfaces of the frames enclosing the cooling fluid channels (the cooling fluid channels (e.g., cooling fluid channel 155-1 and cooling fluid channel 155-2, FIG. 1).

In example implementations, under a fusing or welding scenario (e.g., a laser welding scenario) for the leak-proof joints, a frame (e.g., frame 140-1, frame 140-2) enclosing a cooling fluid channel may be constructed from a metal bracket with openings for the windows (e.g., windows w1 and window w2) and a cover beam. The bracket may, for example, be a planar sheet of metal, or an I-beam, etc. The bracket may form a wall (e.g., a side wall) of the frame (e.g., frame 140-1, frame 140-2, FIG. 1A, FIG. 3A). The cover beam may, for example, be a C-channel beam or a U-channel beam with a C-shape or U-shape cross section, respectively, (e.g., perpendicular to a length of the cover beam).

The power electronics modules (e.g., power electronics module 200A) may be placed over the openings in the bracket. Metal surfaces of the power electronics modules (e.g., surfaces of the power electronics module substrates, or heatsinks or baseplates attached substrates) may be welded to the bracket with laser beams passing through the openings. The metal cover beam (e.g., a U-shape or C-shape beam) may then be placed over and welded to the brackets to form the jacket including a cooling fluid channel.

Figure 3A:
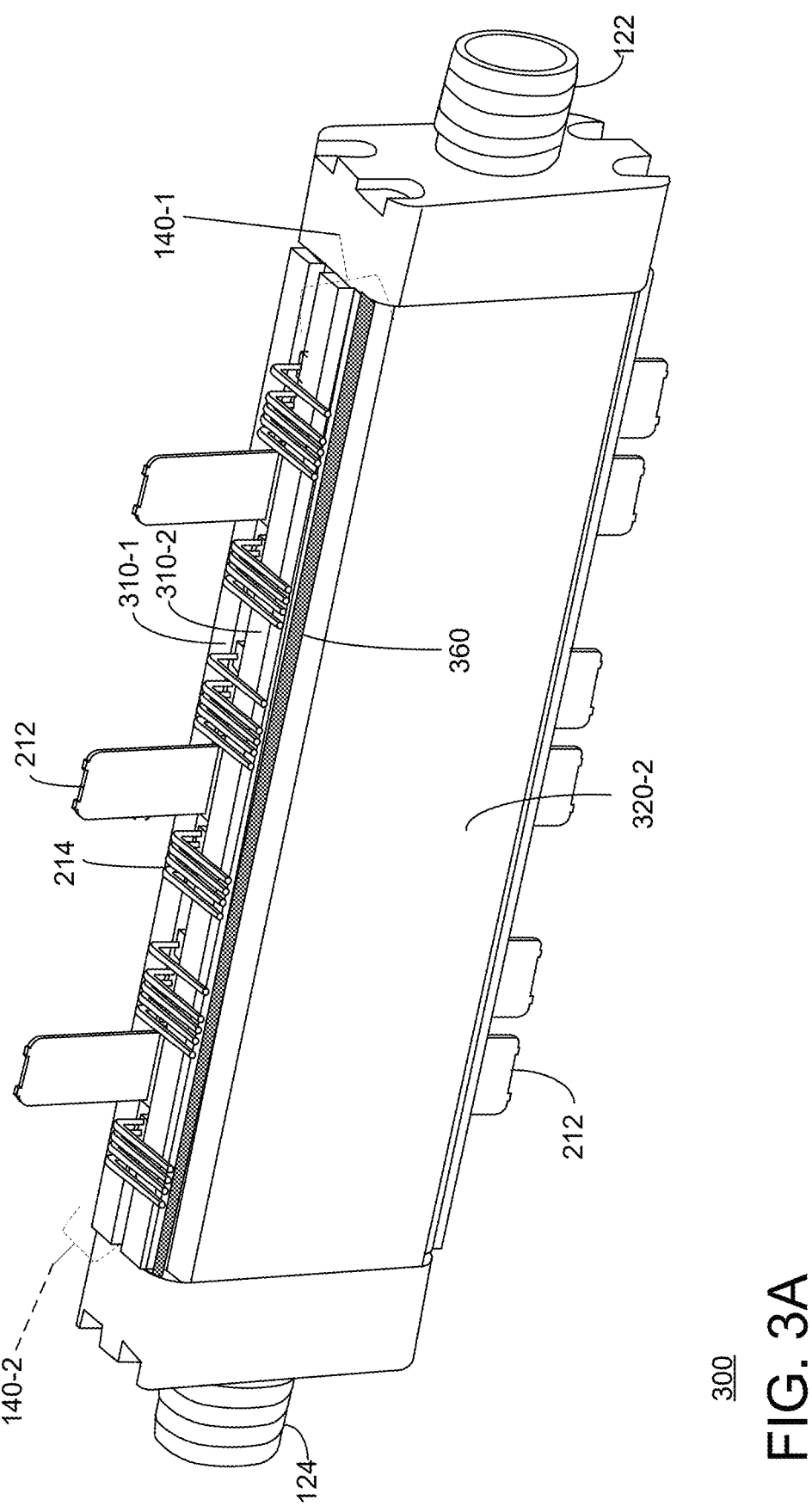
FIG. 3A illustrates an integrated power electronics package.
Figure 3B:
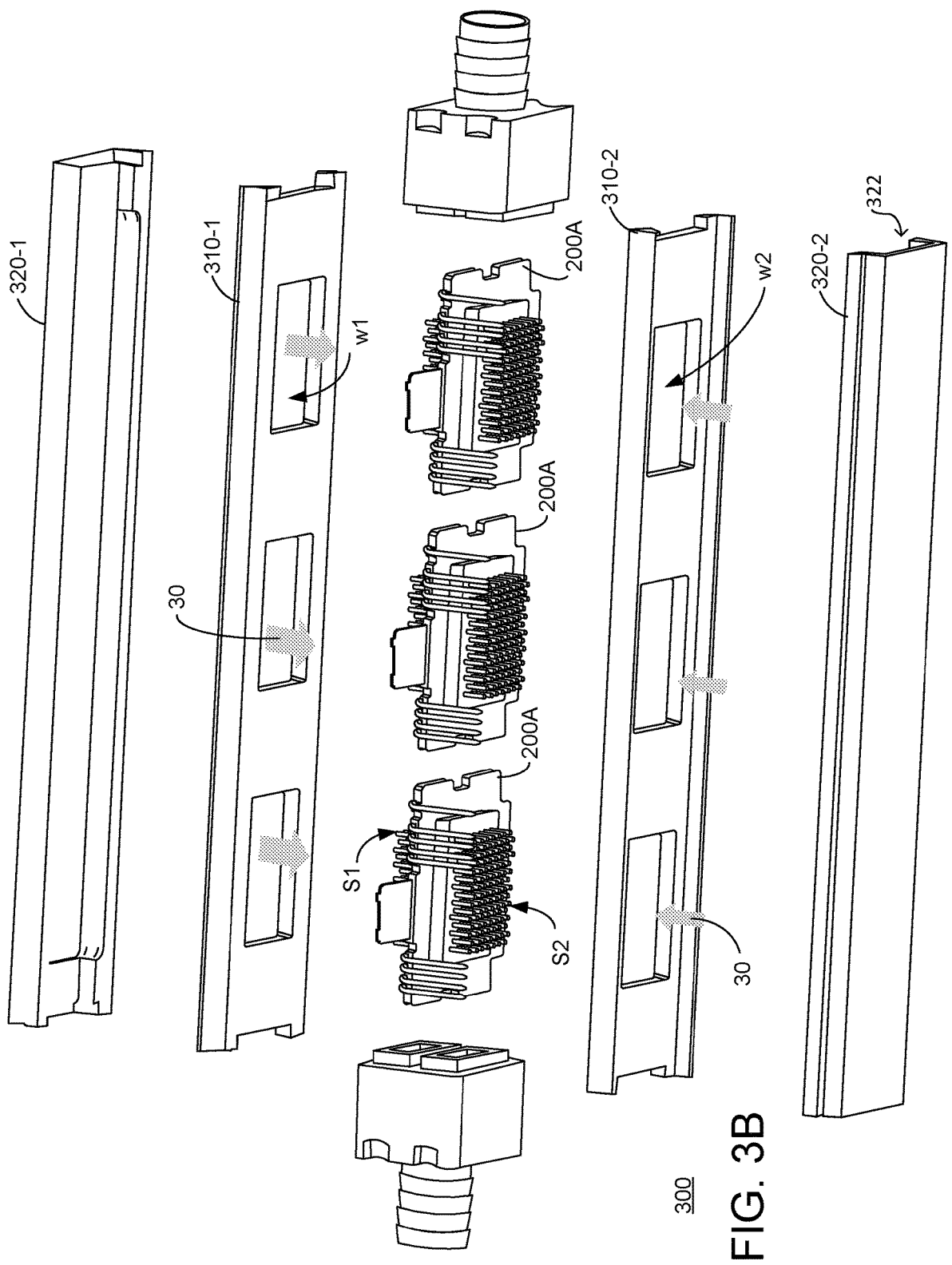
FIG. 3B illustrates an exploded view of the example integrated power electronics package of FIG. 3A.
Figure 3C:
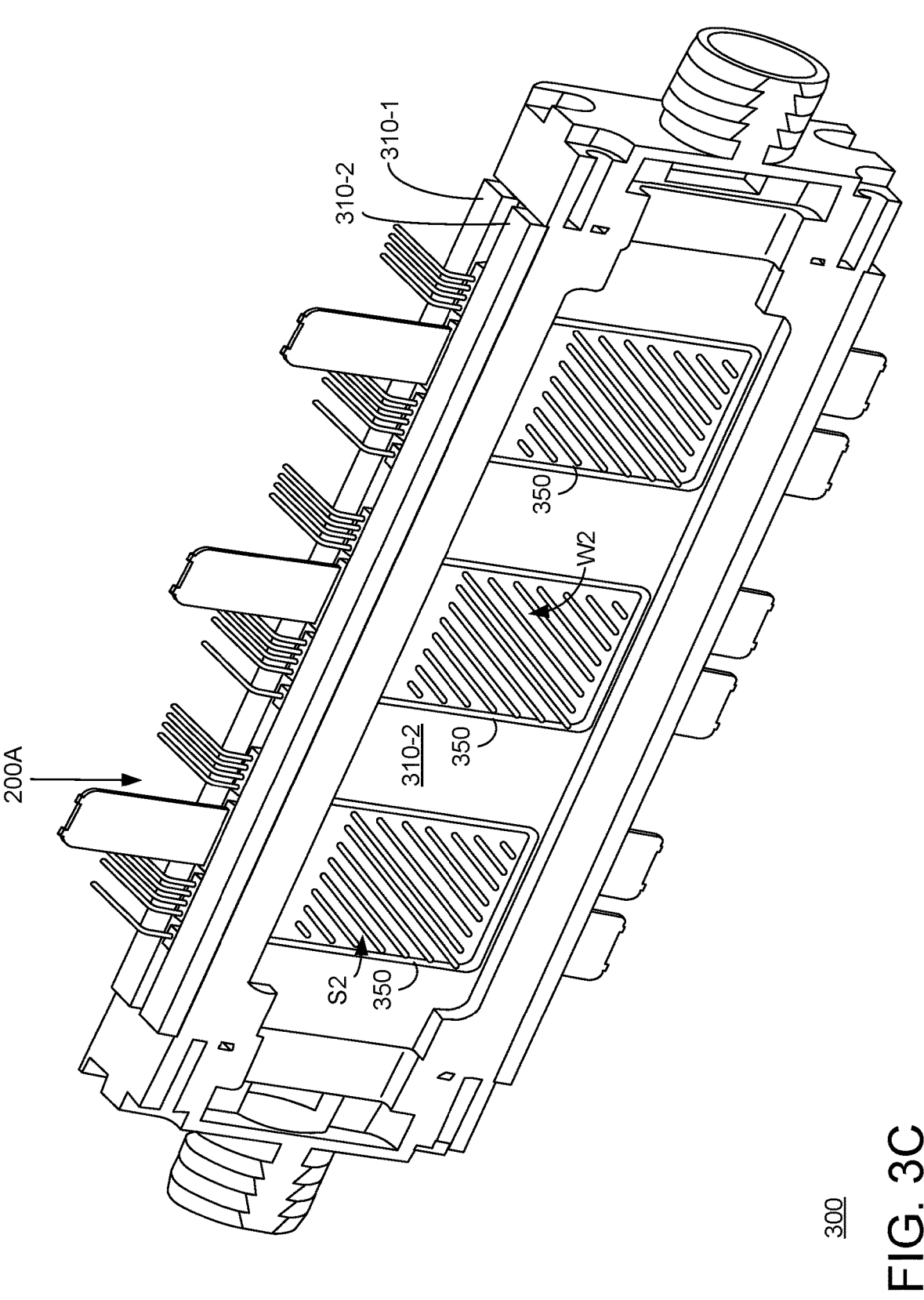
FIG. 3C illustrates a view of the interior of the example integrated power electronics package of FIG. 3A with a portion of a cover beam removed.

FIG. 3A, FIG. 3B, and FIG. 3C show aspects of an example integrated power electronics package 300 that includes laser-welded leak-proof joints between the power electronics modules and the frames enclosing the cooling fluid channels. FIG. 3A shows an exterior perspective view of integrated power electronics package 300. FIG. 3B illustrates an exploded view of the example integrated power electronics package 300 at a stage of construction. FIG. 3C illustrates a view of the interior of the example integrated power electronics package 300 (FIG. 3A) with a portion of a cover beam removed.

As shown in FIGS. 3A-3C, integrated power electronics package 300 may include a row of power electronics modules (e.g., three power electronics module 200A) disposed between frame 140-1 and frame 140-2 (FIG. 1A). The power electronics modules are in the interior of the package and are not fully visible in FIG. 3A. Only power terminals 212 and signal terminals 214 of the power electronics modules (e.g., power electronics module 200A) included in integrated power electronics package 300 are visible in FIG. 3A.

As shown in FIG. 3A, the frames (e.g., frame 140-1 and frame 140-2) may be formed by joining (e.g., welding or fusing) edges of a U-channel beam or a C-channel beam (e.g., cover beam 320-1, cover beam 320-2) to a bracket (e.g., bracket 310-1, bracket 310-2). The cover beam (e.g., cover beam 320-1, cover beam 320-2) may have a U-shape or C-shape cross section perpendicular to its length. The joining (e.g., welding or fusing) of the edges can occur by application of heat and or pressure (e.g., by welding). In FIG. 3A, the joining of the edges of the cover beam (e.g., cover beam 320-2) to the bracket (e.g., bracket 310-2) is depicted as a welding joint (e.g., welding joint 360) extending along a length of the cover beam between input port 122 and output port 124. The cover beam (e.g., cover beam 320-2 may have U-shape cross section (cross section 322, FIG. 3B). The U-shape cross section of the cover beam and the surface of the bracket may define a rectangular cooling fluid channel (e.g., cooling fluid channel 155-1 and cooling fluid channel 155-2, FIG. 1) through which a cooling fluid can flow between input port 122 and output port 124.

As shown in FIG. 3B, the brackets (e.g., bracket 310-1, bracket 310-2) may include openings or windows (e.g., window w1 and window w2). The power electronics modules (e.g., power electronics module 200A) may be disposed in integrated power electronics package 300 to cover (close, seal) the windows so that the cooling fluid flow between input port 122 and output port 124 flows across surfaces of the power electronics modules (e.g., power electronics module 200A) exposed by the windows. Leak-proof joints (e.g., laser welded joint 350, FIG. 3C) may be formed around the perimeters of the windows between surfaces of the bracket and surfaces (e.g., front surface S1, back surface S2) of the power electronics modules covering (closing, sealing) the windows. In example implementations, the power electronics modules may be welded to the brackets by directing laser beams (laser beams 30) through the windows in the brackets before the cover beams (e.g., cover beam 320) are placed over and welded to the brackets.

FIG. 3C shows a view of the interior of the example integrated power electronics package 300 (FIG. 3A) with a portion of a cover beam 320. As shown in FIG. 3C, a leak-proof joint (e.g., laser welded joint 350) is formed between surface S2 of power electronics module 200A and surfaces of bracket 310-2 along a perimeter of window w2 in the bracket.

The adhesive sealant joints (e.g., adhesive sealant joint 240), and the laser welded joints (e.g., laser welded joint

350) described in the foregoing may be robust and resistant to leakage of coolants over the operating temperature ranges of the integrated power electronics packages (e.g., in automotive applications). Further, the adhesive sealant joints and the laser welded joints described herein can be used for robust sealing of the cooling fluid channels against the surfaces of power electronics modules that have dimensions in a range of hundreds of millimeters or greater (e.g., e.g., perimeter dimensions of a 100 millimeters or greater).

While in the examples discussed above, the adhesive sealant joints and laser welded joints are described in the context of making leak-proof joints in applications involving a dual side cooled power electronics module (two sides of which are cooled by two streams of cooling fluids), it will be understood that the adhesive sealant joints and or laser welded joints can be used to make leak-proof joints in applications involving a single side cooled power electronics module (one side of which is cooled by a stream of cooling fluids).

FIG. 4 shows an example method 400 for making a leak-proof joint between a surface of a power electronics module and a surface of a frame enclosing a cooling fluid channel in an integrated power electronics package. The power electronics module may cover an opening (window) in a sidewall of the frame opening to the cooling fluid channel in the frame and be exposed through the opening (window) to the cooling fluids flowing the cooling fluid channel.

Method 400 includes forming a cooling fluid channel in a frame (410), and forming a window in a wall of the frame, the window opening to the cooling fluid channel (420). Method further includes covering the window opening to the cooling fluid channel with a power electronics module (430), and disposing a bead of an adhesive sealant between a surface of the power electronics module and a surface of the frame along a perimeter of the window (440).

Covering the window in the wall of the frame with the power electronics module 430 may expose surfaces (e.g., heat sink or substrate surfaces) to the cooling fluid channel. The bead of the adhesive sealant may form a joint between a surface of the power electronics module and the surface of the frame extending along the perimeter of the window.

In some example implementations, disposing the bead of the adhesive sealant 430 may include disposing the bead of the adhesive sealant on an outside surface of the frame along a perimeter of the window (e.g., in a groove along the perimeter of the window) before covering the window with the power electronics module. In some other example implementations, disposing the bead of the adhesive sealant 430 may include disposing the bead of the adhesive sealant on a surface of the power electronics module before covering the window with the power electronics module. In example implementations, the adhesive sealant may, for example, be a high temperature adhesive sealant (e.g., a silicone rubber, an epoxy, or other polymeric material). The adhesive sealant may have a curing temperature that is within or below a range of a safe operating temperatures of the power electronics module. In some implementations, the curing temperature may, for example, be ≤175° C. In some other implementations, the curing temperature may, for example, be ≤200° C. The adhesive sealant may have a melting temperature that is higher than a range of operating temperatures of the power electronics module. In some implementations, the adhesive sealant may have a melting temperature of about 350° C. or greater.

Method 400 further includes curing the bead of the adhesive sealant at a curing temperature of the adhesive sealant (450).

This curing may form a robust joint that is leak-proof over the range of operating temperatures of the power electronics module. Method 400 may also include attaching end connectors including input and out ports for the cooling fluid channel in the frame to the frame using the adhesive sealant.

FIG. 5 shows an example method 500 for making leak-proof joints between surfaces of a dual side cooled power electronics module and a surface of a first frame enclosing a first cooling fluid channel and a surface of second frame enclosing a second cooling fluid channel in an integrated power electronics package.

Method 500 includes forming a first cooling fluid channel in a first frame (510). The first frame has an opening (window) in a wall of the first frame opening to the first cooling fluid channel in the first frame. Method 500 further includes forming a second cooling fluid channel in a second frame (520). The second frame has an opening (window) in a wall of the second opening to the second cooling fluid channel in the second frame.

Method 500 further includes disposing a power electronics module between the first frame and the second frame with a first side of the power electronics module covering the first opening in the first frame and an opposite second side of the power electronic module covering the second opening in the second frame (530). Method 500 further includes disposing a first bead of an adhesive sealant between the first side of the power electronics module and a surface of the first frame along a perimeter of the first opening (540), and disposing a second bead of the adhesive sealant between the opposite second side of the power electronics module and a surface of the second frame along a perimeter of the second opening (550).

In example implementations, the adhesive sealant may be a silicone material. Method 500 further includes curing the first bead of the adhesive sealant and the second bead of the adhesive sealant at a curing temperature of the adhesive sealant (560). With the sealant adhesive disposed as beads of the adhesive sealant on both the first frame (bottom frame) and the second frame (top frame) a compression force may be applied to form an assembly with the power electronics module sandwiched between the two frames. In alternate implementations, the sealant adhesive may be disposed as beads on the front side and back side surfaces of the power electronics module and then the compression force may be applied to form the assembly with the power electronics module sandwiched between the two frames.

The assembly may be placed in a curing oven at a curing temperature below an allowable maximum temperature of the power electronics module.

In some example implementations, the curing temperature may, for example, be a temperature that is 175° C. or less. In some other example implementations, the curing temperature may, for example, be a temperature that is 200° C. or less.

In some example implementations, method 500 may also include attaching end connectors to the first frame and the second frame, the end connectors including an input port and an output port for the first cooling fluid channel in the first frame and an input port and an output port for the second cooling fluid channel in the second frame. The end connectors may be attached to the first frame and the second frame using the FIG. 6 shows an example method 600 for making a leak-proof joint between a surface of a power electronics module and a surface of a frame enclosing a cooling fluid channel in an integrated power electronics package. The power electronics module may cover an opening (window) in a wall of the frame opening to the cooling fluid channel in the frame and may be exposed through the window to the cooling fluids flowing the cooling fluid channel. In example implementations, the wall of the frame enclosing a cooling fluid channel may be a bracket (e.g., a sheet of metal, an I-beam, etc.) with an opening (window) in the wall. The frame is formed by attaching a cover beam (e.g., a C-shape channel beam, or a U-shape channel beam) to the bracket. The cooling fluid channel is formed by the space between the cover beam (e.g., a C-shape channel beam, of a U-shape channel beam) and the bracket.

Method 600 includes disposing a power electronics module on a bracket with a side of the power electronic module covering an opening in the bracket (610). Method 600 further includes joining a surface of the power electronic module to the bracket around a perimeter of the opening in the bracket to form a leak-proof joint between the power electronic module and the bracket (620). This joining (e.g., fusing or welding) may form a leak-proof joint between the power electronic module and the bracket. In example, implementations, the surface of the power electronic module may be a metalized surface of a substrate (e.g., a DBC substrate) or a surface of a heatsink or baseplate attached to the side of the power electronic module. In some example implementations, the joining 620 may include laser welding. In some other example implementations, the joining 620 may include friction stir welding.

Method 600 further includes disposing a cover beam over the power electronic module disposed on the bracket (630), and fusing the cover beam and the bracket together along a length of the bracket (640). The cover beam and the bracket can form a frame enclosing a cooling fluid channel for cooling fluid flow over the power electronic module. The cover beam may be a U-channel beam or a C-channel beam) in other words, a beam having a U-shape or C-shape cross section perpendicular to its length). The space between the cover beam and the bracket forms the cooling fluid channel for flow of cooling fluids over the power electronics module.

Method 600 may further include attaching end connectors to the frame (650). The end connectors can include input and output ports for the cooling fluid channel in the frame. In example implementations, the end connectors may be attached to the frame using adhesive sealants or by joining (e.g., by fusing or welding) the end connectors and the frame).

FIG. 7 shows an example method 700 for making leak-proof joints between surfaces of a dual side cooled power electronics module and a surface of a first frame enclosing a first cooling fluid channel and a surface of second frame enclosing a second cooling fluid channel in an integrated power electronics package.

Method 700 includes disposing a power electronics module between a first bracket and a second bracket with a first side of the power electronics module covering an opening in the first bracket and an opposite second side of the power electronics module covering an opening in the second bracket (710). Method 700 further includes joining a surface of the first side of the power electronic module to the first bracket along a perimeter of the opening in the first bracket to form a leak-proof joint between the power electronic module and the first bracket (720), and joining a surface of the second side of the power electronic module to the second bracket along a perimeter of the opening in the second bracket to form a leak-proof joint between the power electronic module and the second bracket (730).

In example implementations, the surface on the first side of the power electronic module may be a metalized surface of a substrate (e.g., a DBC substrate) or a surface of a heatsink or baseplate attached to the first side of the power electronic module. Likewise, the surface on the second side of the power electronic module may be a metalized surface of a substrate (e.g., a DBC substrate) or a surface of a heatsink or baseplate attached to the second side of the power electronic module.

In some example implementations, joining the surface of the first side of the power electronic module 720 may include one of fusing, welding, and friction stir welding. Likewise, joining the surface of second side of the power electronic module 730 may include one of fusing, laser welding, and friction stir welding.

Method 700 further includes disposing a first cover beam on the first bracket over the power electronics module and disposing a second cover beam on the second bracket over the power electronics module (740). The first cover beam and the second cover beam may be a U-channel beam or a C-channel beam (in other words, a beam having a U-shape or C-shape cross section perpendicular to its length).

Method 700 further includes joining the first cover beam and the first bracket together along a length of the first bracket forming a first frame enclosing a first cooling fluid channel for cooling fluid flow over the power electronic module and joining the second cover beam and the second bracket together along a length of the second bracket forming a second frame enclosing a second cooling fluid channel for cooling fluid flow over the power electronic module (750). The space between the first cover beam and the first bracket forms the first cooling fluid channel for flow of cooling fluids over the power electronics module in the first frame. The space between the second cover beam and the second bracket forms the first cooling fluid channel for flow of cooling fluids over the power electronics module in the second frame.

Method 700 may further include attaching end connectors to the first frame and the second frame (760). The end connectors can include input and output ports for the first cooling fluid channel in the first frame and the second cooling fluid channel in the second frame. In example implementations, the end connectors may be attached to the frames using adhesive sealants or by joining (e.g., fusing or welding) the end connectors and the frames.

The various implementations described herein are given only by way of example and only for purposes of illustration. It will be understood, for purposes of this disclosure, that when an element, such as a layer, a region, a component, or a substrate, is referred to as being on, mechanically connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification and or shown in the figures.

As used in this specification, a singular form may, unless indicating a particular case in the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method, comprising:

welding a surface of a power electronics module to a first bracket around a perimeter of an opening in the first bracket to form a leak-proof joint between the power electronics module and the first bracket;

welding a surface of an opposite second side of the power electronics module to a second bracket along a perimeter of a second opening in the second bracket to form a leak-proof joint between the power electronics module and the second bracket;

welding a first cover beam and the first bracket together along a length of the first bracket, the first cover beam and the first bracket forming first enclosure for a first cooling fluid channel configured to direct cooling fluid over the power electronics module;

welding a second cover beam and the second bracket together along a length of the second bracket, the second cover beam and the second bracket forming a second enclosure for a second cooling fluid channel configured to direct the cooling fluid over the power electronics module;

attaching a first end connector to a first end of the first enclosure and the second enclosure, the first end connector including an input port; and attaching a second end connector to a second end of the first enclosure and the second enclosure opposite the first end, the second end connector including an output port, wherein the input port and the output port are axially aligned in a direction corresponding to the length of the bracket.

2. The method of claim 1, wherein the cover beam is a U-channel beam or a C-channel beam.

3. The method of claim 1, wherein the power electronics module includes a plurality of fins extending through the opening in the first bracket.

4. A method, comprising:

welding a surface of a first side of a power electronics module to a first bracket along a perimeter of a first opening in the first bracket to form a leak-proof joint between the power electronics module and the first bracket;

welding a surface of an opposite second side of the power electronics module to a second bracket along a perimeter of a second opening in the second bracket to form a leak-proof joint between the power electronics module and the second bracket;

welding a first cover beam to the first bracket, the first cover beam and the first bracket forming a first enclosure for a first cooling fluid channel configured to direct cooling fluid over the first side of the power electronics module;

welding a second cover beam to the second bracket, the second cover beam and the second bracket forming a second enclosure for a second cooling fluid channel configured to direct the cooling fluid over the second side of the power electronics module;

attaching a first end connector to the first enclosure and the second enclosure, the first end connector including a first channel connector, a second channel connector, and an inlet port, such that the first channel connector is attached to a first end of the first enclosure, and the second channel connector is attached to a first end of the second enclosure; and attaching a second end connector to the first enclosure and the second enclosure, the second end connector including a third channel connector, a fourth channel connector, and an outlet port, such that the third channel connector is attached to a second end of the first enclosure, and the fourth channel connector is attached to a second end of the second enclosure.

5. The method of claim 4, wherein the first cover beam and the second cover beam are U-channel beams or C-channel beams.

6. The method of claim 4, wherein the power electronics module includes a plurality of fins extending through the first opening in the first bracket.

7. The method of claim 4, wherein attaching the first end connector and the second end connector to the first enclosure and the second enclosure includes attaching the first end connector and the second end connector using adhesive sealants or by welding.

8. The method of claim 4, wherein the power electronics module is welded to a first side of the first bracket and the first cover beam is disposed over an opposite second side of the first bracket; and wherein the power electronics module is welded to a first side of the second bracket and the second cover beam is disposed over an opposite second side of the second bracket.

9. The method of claim 4, wherein the first channel connector protrudes from a surface of the first end connector and is inserted into the first enclosure;

wherein the second channel connector protrudes from the surface of the first end connector and is inserted into the second enclosure;

wherein the third channel connector protrudes from a surface of the second end connector and is inserted into the first enclosure; and wherein the fourth channel connector protrudes from the surface of the second end connector and is inserted into the second enclosure.

10. The method of claim 4, wherein welding the surface of the first side of the power electronics module to the first bracket includes directing laser beams through the first opening; and wherein welding the surface of the opposite second side of the power electronics module to the second bracket includes directing laser beams through the second opening.

11. A package comprising:

a power electronics module disposed between a first bracket and a second bracket with a first side of the power electronics module covering an opening in the first bracket and an opposite second side of the power electronics module covering an opening in the second bracket;

a first weld joint between a surface of the first side of the power electronics module and the first bracket along a perimeter of the opening in the first bracket;

a second weld joint between a surface of the opposite second side of the power electronics module and the second bracket along a perimeter of the opening in the second bracket;

a first cover beam disposed on the first bracket over the power electronics module, the first cover beam and the first bracket forming a first enclosure for a first cooling fluid channel configured to direct cooling fluid over the power electronics module, the first cover beam attached to the first bracket by a third weld joint;

a second cover beam disposed on the second bracket over the power electronics module, the second cover beam and the second bracket forming a second enclosure for a second cooling fluid channel configured to direct the cooling fluid over the power electronics module, the second cover beam attached to the second bracket by a fourth weld joint;

a first end connector including a first channel connector attached to a first end of the first enclosure, a second channel connector attached to a first end of the second enclosure, and an inlet port; and a second end connector including a third channel connector attached to a second end of the first enclosure, a fourth channel connector attached to a second end of the second enclosure, and an outlet port.

12. The package of claim 11, wherein the power electronics module includes a plurality of fins extending through the opening in the first bracket.

13. The package of claim 11, wherein the power electronics module is welded to a first side of the first bracket and the first cover beam is disposed over an opposite second side of the first bracket; and wherein the power electronics module is welded to a first side of the second bracket and the second cover beam is disposed over an opposite second side of the second bracket.

14. The package of claim 11, wherein the first channel connector protrudes from a surface of the first end connector and is inserted into the first enclosure;

wherein the second channel connector protrudes from the surface of the first end connector and is inserted into the second enclosure;

wherein the third channel connector protrudes from a surface of the second end connector and is inserted into the first enclosure; and wherein the fourth channel connector protrudes from the surface of the second end connector and is inserted into the second enclosure.

15. A package comprising:

a power electronics module coupled to a first bracket and a second bracket, wherein a bottom surface of the power electronics module is welded the first bracket around a perimeter of an opening in the first bracket to form a leak-proof joint between the power electronics module and the first bracket, and wherein a top surface of the power electronics module is welded to the second bracket around a perimeter of an opening in the second bracket to form a leak-proof joint between the power electronics module and second first bracket;

a first cover beam coupled to the first bracket, wherein the first cover beam and the first bracket are welded together along a length of the first bracket, the first cover beam and the first bracket forming a first enclosure for a first cooling fluid channel configured to direct cooling fluid over the power electronics module;

a second cover beam coupled to the second bracket, wherein the second cover beam and the second bracket are welded together along a length of the second bracket, the second cover beam and the second bracket forming a second enclosure for a second cooling fluid channel configured to direct the cooling fluid over the power electronics module;

a first end connector attached to a first end of the first enclosure and the second enclosure, the first end connector including an input port; and a second end connector attached to a second end of the first enclosure and the second enclosure opposite the first end, the second end connector including an output port, wherein the input port and the output port are axially aligned in a direction corresponding to the length of the bracket.

16. The package of claim 15, wherein the power electronics module includes a plurality of fins extending through the opening in the first bracket.

17. The package of claim 15, wherein the power electronics module is a first power electronics module, wherein a surface of a second power electronics module is welded to the first bracket around a perimeter of a third opening in the first bracket to form a leak-proof joint between the second power electronics module and the first bracket.

18. The package of claim 15, wherein a portion of the power electronics module is exposed to the cooling fluid channel through the opening in the first bracket.

* * * * *